(12) United States Patent
Lee et al.

(10) Patent No.: US 9,214,438 B2
(45) Date of Patent: Dec. 15, 2015

(54) DIE-DIE STACKING STRUCTURE AND METHOD FOR MAKING THE SAME

(71) Applicant: ADVANCED MICRO DEVICES (SHANGHAI) CO. LTD, Pudong District, Shanghai (CN)

(72) Inventors: I-Tseng Lee, Kaohsiung (CN); Yi Hsiu Liu, Kaohsiung (CN)

(73) Assignee: Advanced Micro Devices (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/633,205

(22) Filed: Feb. 27, 2015

(65) Prior Publication Data

US 2015/0171043 A1 Jun. 18, 2015

Related U.S. Application Data

(63) Continuation of application No. 14/159,813, filed on Jan. 21, 2014, now Pat. No. 8,994,191.

(51) Int. Cl.
*H01L 29/40* (2006.01)
*H01L 23/52* (2006.01)
*H01L 23/48* (2006.01)
*H01L 23/00* (2006.01)
*H01L 25/065* (2006.01)

(52) U.S. Cl.
CPC ............... *H01L 24/17* (2013.01); *H01L 24/29* (2013.01); *H01L 24/32* (2013.01); *H01L 24/83* (2013.01); *H01L 25/0657* (2013.01); *H01L 24/13* (2013.01); *H01L 24/16* (2013.01); *H01L 24/81* (2013.01); *H01L 2224/1356* (2013.01); *H01L 2224/13082* (2013.01); *H01L 2224/13147* (2013.01); *H01L 2224/16113* (2013.01); *H01L 2224/16221* (2013.01); *H01L 2224/16227* (2013.01); *H01L 2224/17134* (2013.01); *H01L 2224/17179* (2013.01); *H01L 2224/17515* (2013.01); *H01L 2224/17517* (2013.01); *H01L 2224/26125* (2013.01); *H01L 2224/26155* (2013.01); *H01L 2224/29011* (2013.01); *H01L 2224/29012* (2013.01);
(Continued)

(58) Field of Classification Search
CPC ..... H01L 2224/81; H01L 24/81; H01L 24/83; H01L 24/17; H01L 2224/73204; H01L 23/4952
USPC .................................. 257/780, 781, 782, 778
See application file for complete search history.

(56) References Cited

U.S. PATENT DOCUMENTS 6,774,497 B1 * 8/2004 Qi et al. ................ 257/783
6,960,793 B2 * 11/2005 Ushiyama ............. 257/207
8,237,294 B2 * 8/2012 Takamoto et al. ..... 257/783

(Continued)

*Primary Examiner* — S. V. Clark
(74) *Attorney, Agent, or Firm* — Faegre Baker Daniels LLP

(57) ABSTRACT

The present invention relates to die-die stacking structure and the method for making the same. The die-die stacking structure comprises a top die having a bottom surface, a first insulation layer covering the bottom surface of the top die, a bottom die having a top surface, a second insulation layer covering the top surface of the bottom die, a plurality of connection members between the top die and the bottom die and a protection material between the first insulation layer and the second insulation layer. The plurality of connection members communicates the top die with the bottom die. The protection material bridges the plurality of connection members to form a mesh layout between the first insulation layer and the second insulation layer. The structure and method of present invention at least provide more strength and stress buffer to resist die warpage and absorb thermal cycling stress, and then prevents the bump and dielectric materials in the die-die stacking structure from cracking caused by thermal stress or external mechanical stress.

13 Claims, 3 Drawing Sheets

(52) U.S. Cl.
CPC ............... *H01L 2224/2919* (2013.01); *H01L 2224/29019* (2013.01); *H01L 2224/32057* (2013.01); *H01L 2224/32058* (2013.01); *H01L 2224/32059* (2013.01); *H01L 2224/32225* (2013.01); *H01L 2224/73204* (2013.01); *H01L 2224/81191* (2013.01); *H01L 2224/81193* (2013.01); *H01L 2224/83191* (2013.01); *H01L 2224/83193* (2013.01); *H01L 2924/07025* (2013.01); *H01L 2924/15311* (2013.01); *H01L 2924/351* (2013.01)

(56) References Cited

U.S. PATENT DOCUMENTS

| | | | | |
|---|---|---|---|---|
| 8,541,883 | B2* | 9/2013 | Cheng et al. | 257/774 |
| 2005/0006744 | A1* | 1/2005 | Ooi et al. | 257/686 |
| 2005/0006745 | A1* | 1/2005 | Nishimura | 257/686 |
| 2009/0283904 | A1* | 11/2009 | Ali et al. | 257/737 |
| 2010/0164076 | A1* | 7/2010 | Lee et al. | 257/659 |
| 2012/0068364 | A1* | 3/2012 | Mengel et al. | 257/783 |
| 2014/0306338 | A1 | 10/2014 | Lee et al. | |

* cited by examiner

DIE-DIE STACKING STRUCTURE AND METHOD FOR MAKING THE SAME

RELATED APPLICATIONS

This application is a continuation of co-pending U.S. application Ser. No. 14/159,813, filed Jan. 21, 2014, owned by instant assignee and is incorporated herein by reference.

TECHNICAL FIELD OF THE INVENTION

The present invention relates to die-die stacking flip chip packages. Specifically, the present invention relates to a die-die stacking structure and the method for making the same.

BACKGROUND OF THE INVENTION

The die-die stacking package technology is making rapid development in recent years. The technology is a developing trend of integrated circuit advanced high-density packaging, which is an advanced die assembly technology for achieving more reliable, high performance and higher-density circuits.

FIG. 1 illustrates an existing die-die stacking structure 100. The die-die stacking structure includes dies 101, 102 and 103. Die 103 is disposed below dies 101 and 102. A plurality of fine pitch (e.g. 45 μm) bumps 104 are designed for the connection of dies 101, 102 to die 103. A plurality of fine pitch bumps 105 are designed for the connection of die 103 to substrate 107. To strengthen the stability of the bumps 104, 105 and dies 101, 102 and 103, underfill 106 is applied to fully fill the space between die 101 and die 103, die 102 and die 103, and die 103 and substrate 107 and extend beyond the outer edges and bottom edges of dies 101, 102 and 103 to form a fillet 108.

However, this kind of die-die stacking structure has some shortcomings as follows. First, fully filling the space between dies 101, 102 and die 103, and die 103 and substrate 107 can induce void in the underfill 106 more easily. Also, it is easier to produce die-underfill delamination or popcorn failure induced by moisture and thermal stress in the fully filled package. In addition, the formed underfill fillets 108 surrounding the outer side of dies 101, 102 and 103 may more easily cause dies to crack due to higher underfill fillet height and stain the active area of dies. Furthermore, it can lead to die or component layout space utilization waste due to reservation of die-die/component space for underfill dispensing, fillet and bleeding. Moreover, it needs a long underfill dispensing process cycle time caused by slow underfill due to fine bump pitch design or smaller die gap between die 101 and die 103, die 102 and die 103.

FIG. 2 illustrates another existing die-die stacking structure 200, in which the upper die 201 and the lower die 202 are connected through multiple bumps 203. Underfill 204 is also fully filled between die 201 and die 202 to protect the bumps 203. Obviously, the die-die stacking structure 200 in FIG. 2 also has the above shortcomings.

FIG. 3 illustrates another existing die-die stacking structure 300, in which the upper die 301 and the lower die 302 are connected through multiple bumps 303. There is no fully filled underfill between the upper die and the lower die. The bumps 303 are protected by protect type flux 304. However, the flux 304 covering the bumps is insufficient and does not form a solid structure to absorb and resist thermal stress induced by die-die warpage during reflow or thermal cycle test. Therefore, the bump protection for fatigue/stress crack failure in structure 300 is weak due to insufficient material cover the bump and material protection discontinuity.

Therefore, there is a need to provide an improved die-die stacking structure and method that overcome the shortcomings in the existing die-die stacking structures.

SUMMARY OF THE INVENTION

To overcome the shortcomings in the existing die-die stacking structures, the present invention provides an improved die-die stacking structure and method with better performance.

In the first place, a die-die stacking structure is provided. The die-die stacking structure comprises a top die having a bottom surface, a first insulation layer covering the bottom surface of the top die, a bottom die having a top surface, a second insulation layer covering the top surface of the bottom die, a plurality of connection members between the top die and the bottom die and a protection material between the first insulation layer and the second insulation layer. The plurality of connection members communicate the top die with the bottom die. The protection material bridges the plurality of connection members to form a mesh layout between the first insulation layer and the second insulation layer.

In the second place, the present invention provides a die-die stacking structure. The die-die stacking structure comprises a top die having a bottom surface, a first insulation layer covering the bottom surface of the top die, a bottom die having a top surface, a second insulation layer covering the top surface of the bottom die, a plurality of connection members between the top die and the bottom die, a plurality of dummy bump units between the first insulation layer and the second insulation layer, and a protection material between the first insulation layer and the second insulation layer. The plurality of connection members communicate the top die with the bottom die. The dummy bump units do not communicate the top die with the bottom die. The protection material bridges the plurality of connection members and dummy bump units to form a mesh layout between the first insulation layer and the second insulation layer.

In the third place, the present invention provides a method for making a die-die stacking structure, comprising the steps of: a) providing a top die assembly and a bottom die assembly, wherein, the top die assembly comprises a top die and a plurality of first connecting members connecting with the top die, and the bottom die assembly comprises a bottom die and a plurality of second connecting members connecting with the bottom die; b) jetting a protection material onto the top surface of the bottom die assembly to make the protection material bridge the plurality of second connecting members to form a mesh layout; c) making a bottom surface of the top die assembly dip into the protecting material; d) placing the top die assembly on the bottom die assembly with each of the first connecting members of the top die assembly aligning with a corresponding second connecting member of the bottom die assembly; e) connecting each of the first connection members of the top die assembly with the corresponding second connecting member of the bottom die assembly through a solder joint there-between such that the top die being in communication connection with the bottom die.

In the fourth place, the present invention provides a method for making a die-die stacking structure, comprising the steps of: a) providing a top die assembly and a bottom die assembly, wherein, the top die assembly comprises a top die, a first insulation layer covering the bottom surface of the top die, a plurality of first bumps connecting with the bottom surface of the first insulation layer and a plurality of first connecting members connecting with the top die, and the bottom die assembly comprises a bottom die, a second insulation layer covering the upper surface of the bottom die, a plurality of second bumps connecting with the top surface of the second insulation layer and a plurality of second connecting members connecting with the bottom die; b) jetting a protection material onto the top surface of the bottom die assembly to make the protection material bridge the plurality of second connecting members and second bumps to form a mesh layout; c) making a bottom surface of the top die assembly dip into the protecting material; d) placing the top die assembly on the bottom die assembly with each of the first connecting members of the top die assembly aligning with a corresponding second connecting member of the bottom die assembly; e) connecting each of the first connection members of the top die assembly with the corresponding second connecting members of the bottom die assembly through a solder joint therebetween such that the top die being in communication connection with the bottom die.

By providing the steps in the above mentioned method and above-mentioned die-die stacking structures, the present invention overcomes the above mentioned shortcomings in the existing die-die stacking structures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. In addition, in the detailed description of the embodiments, directional terminology, such as "top," "bottom," "front," "rear," "side," "left," "right," "forward," "trailing," etc., is used with reference to the orientation of the Figure(s) being described. Because components of embodiments of present invention can be positioned in a number of different orientations, the directional terminology is used for purposes of illustration and is in no way limiting.

Figure 4:
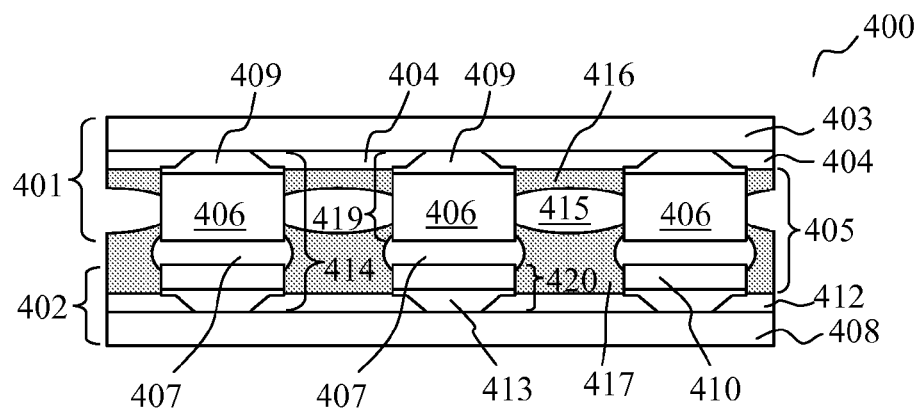
FIG. 4 depicts a partial structure schematic view of a die-die stacking structure 400 according to one explanatory embodiment.

Referring to FIG. 4, there is shown a partial structure schematic view of a die-die stacking structure 400 according to one explanatory embodiment. As shown in FIG. 4, the die-die stacking structure 400 includes top die assembly 401, bottom die assembly 402, a plurality of solder joints 407 and protection materials 405.

The top die assembly 401 includes top die 403, insulation layer 404 and a plurality of first connecting members 419. Each first connecting member 419 comprises a bump 406 and a connecting element 409. The insulation layer 404 covers the bottom surface of the top die 403. The top end of each of the bumps 406 is connected with bottom end of a corresponding connecting element 409. The top end of the connecting element 409 in turn passes through the insulation layer 404 and connects with the top die 403.

Likewise, as shown in FIG. 4, the bottom die assembly 402 includes bottom die 408, an insulation layer 412 and a plurality of second connecting members 420. Each second connecting member 420 comprises a bump 410 and a connecting element 413. The insulation layer 412 covers the top surface of the bottom die 408. The bottom end of each of the bumps 410 is connected with the top end of a corresponding connecting element 413. The bottom end of the connecting element 413 in turn passes through the insulation layer 412 and connects with the bottom die 408.

The top die assembly 401 is in communication connection with the bottom die assembly 402 by connecting each bump 406 of the top die assembly 401 with corresponding bump 410 of the bottom die assembly 402 through solder joint 407. After one of the bumps 406 of the top die assembly 401 is connected with a corresponding bump 410 of the bottom die assembly 402 by solder joint 407, each of the first connecting members 419, each of the second connecting members 420 and the solder joint 407 form a connection member 414 between the top die 403 and the bottom die 408, namely the connecting member 414 comprising the connecting element 409, the bump 406, solder joint 407, the bump 410 and the connecting element 413. That is to say, the connection member 414 comprises a first connecting element (i.e. the connecting element 409), a second connecting element (i.e. the bump 406), a third connecting element (i.e. the solder joint 407), a fourth connecting element (i.e. the bump 410) and a fifth connecting element (i.e. the connecting element 413) connected in sequence from top to bottom, wherein the top end of the first connecting element passes through the insulation layer 404 to connect with the top die 403, the bottom end of the fifth connecting element passes through the insulation layer 412 to connect with the bottom die 408, thereby the top die 403 being connected with the bottom die 408 by the plurality of connection members 414. Through a plurality of such connecting members 414, the top die 403 is in communication connection with the bottom die 408 (only three connection members 414 are shown in FIG. 4 because FIG. 4 is a partial structure schematic view).

In the embodiment shown in FIG. 4, the insulation layer 404 or 412 can be formed by the material of polyimide (PI). Of course, it also can be formed by other appropriate material. The connecting element 409 or 413 can be formed by the material of conductive metal or alloy. Preferably, the bumps 406 and 410 can be Cu pillar. In another embodiment (not shown in FIG. 4), the bumps 410 of the bottom die assembly 402 are optional and can be omitted. When bumps 410 are omitted, the solder joint 407 will directly connect with the connecting element 413 accordingly. That is to say, the fourth connecting element can be omitted. When the fourth connecting element is omitted, the second connecting member 420 only includes the fifth connecting element and the third connecting element will directly connect with the fifth connecting element.

Figure 5:
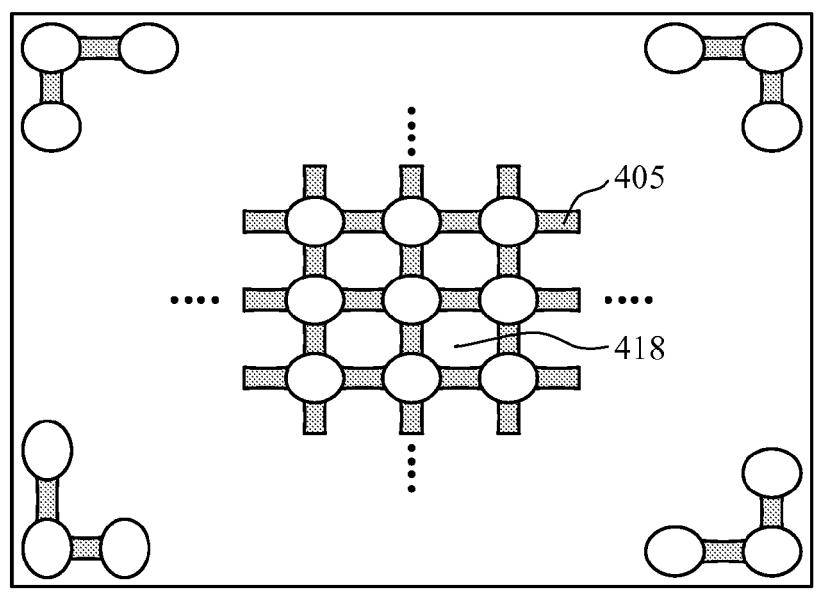
FIG. 5 depicts a top schematic view of a die-die stacking structure 400 of FIG. 4.

Referring to FIGS. 4 and 5, protection material 405 is between the top die assembly 401 and the bottom die assembly 402. Specifically, the protection material 405 is between insulation layer 404 and the insulation layer 412. The protection material 405 bridges the plurality of connection members 414, thereby forming a mesh layout as best shown in FIG. 5. The protection material 405 bridging two adjacent connection members 414 has hollow space 415 therein which divides the protection material 405 into two segments namely, upper segment 416 and bottom segment 417 as best shown in FIG. 4. One of the two segments (either upper segment 416 or bottom segment 417) covers a part of the solder joint 407.

In an alternative solution, the upper segment 416 can be replaced by an insulation material such as the insulation layer 404 built by bumping process, but still keeping a mesh layout among the bumps 406. The mesh layout and hollow space 415 establish an open space 418 between the insulation layer 404 and the insulation layer 412.

The bumps 406 and 410, for example, can be Cu pillar. Of course, the bumps also can be made of other appropriate materials. The protection materials 405 can be joint protection type flux, non-conductive paste (NCP) or non-flow underfill. polyimide can be used as an alternative material for the upper segment 416 of protection material 405.

Figure 6:
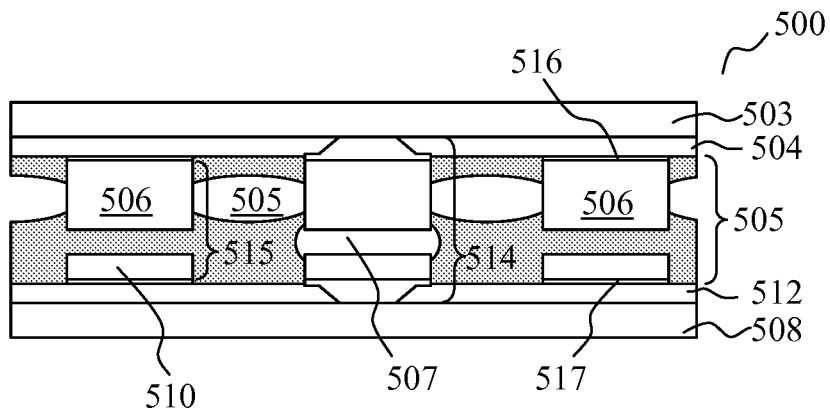
FIG. 6 depicts a partial structure schematic view of the die-die stacking structure 500 according to another explanatory embodiment.

Referring to FIG. 6, there is shown a partial structure schematic view of a die-die stacking structure 500 according to another explanatory embodiment. In this die-die stacking structure 500, there are also a plurality of connection members 514 connecting the top die 503 with the bottom die 508 which are the same as the connection members 414 in FIG. 4 (only one connection member 514 is shown in FIG. 6 because FIG. 6 is a partial cross section view). The difference between the structure 500 and the structure 400 is that the structure 500 has a plurality of dummy bump units 515 between the insulation layer 504 and the insulation layer 512. High density dummy bump unit design can reduce the connection members 514 crack risk. The protection material 505 bridges the plurality of connection members 514 and dummy bump units 515 to form a mesh layout similar to that shown in FIG. 5. The dummy bump units 515 do not communicate the top die 503 with the bottom die 508.

In the embodiment shown in FIG. 6, each of the dummy bump units 515 comprises an upper bump or first bump 506 and a bottom bump or second bump 510. The top end of the upper bump 506 is connected with insulation layer 504 by a connecting element 516. The bottom end of the bottom bump 510 is connected with insulation layer 512 by a connection element 517. The upper bump 506 can be connected with the bottom bump 510 through a solder joint 507 (not shown in FIG. 6). In another embodiment, the solder joint 507 connecting the upper bump 506 and the bottom bump 510 is optional and can be omitted. For example, the upper bump 506 shown in FIG. 6 is not connected with the bottom bump 510. In another embodiment, the bottom bump 510 is optional and can be omitted.

The present invention also provides a method for making a die-die stacking structure, for example as shown in FIGS. 4 and 6.

Figure 7:
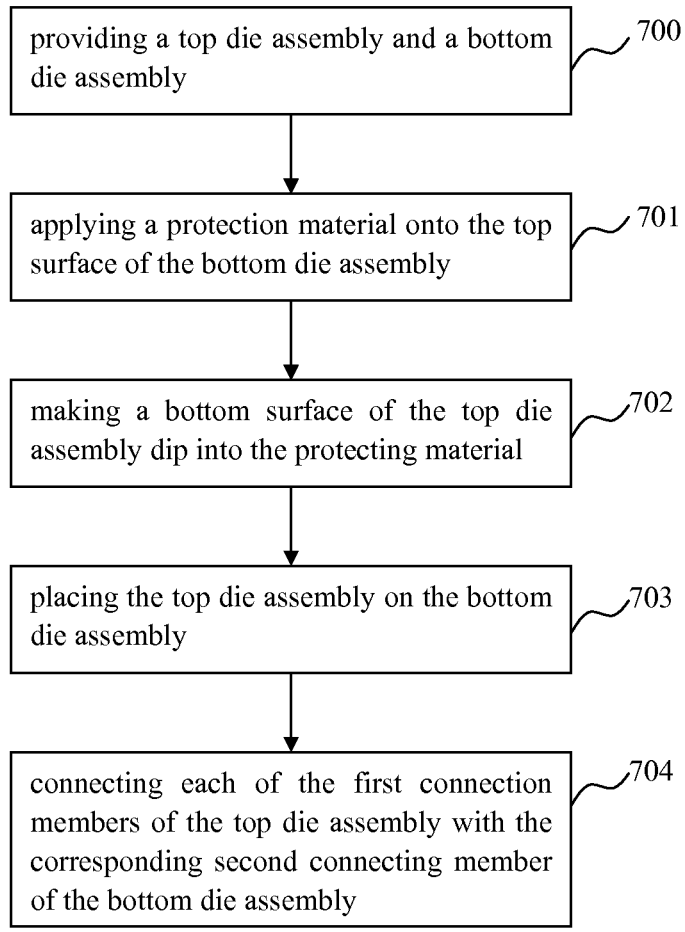
FIG. 7 depicts a flowchart for the method of making the die-die stacking structure according to one explanatory embodiment.

In an embodiment, the method for making a die-die stacking structure includes the following steps as shown in FIG. 7. The first step 700 is providing a top die assembly and a bottom die assembly as described above referring to FIGS. 4-6. The top die assembly comprises a top die and a plurality of first connecting members connecting with the bottom surface of the top die. The bottom die assembly comprises a bottom die and a plurality of second connecting members connecting with the upper surface of the bottom die.

In the second step 701, a protection material is applied onto the upper surface of the bottom die assembly to make the protection material bridge the plurality of second connecting members to form a mesh layout as best shown in FIG. 5. The protection material can be applied on the upper surface of the bottom die assembly through, for example, jetting, pasting or printing. The protection material may be joint protection type flux, non-conductive paste or non-flow underfill.

In the third step 702, the bottom surface of the top die assembly is made to dip into the protecting material to make the protection material bridge the plurality of first connecting members to form a mesh layout.

In the fourth step 703, the top die assembly is placed on the bottom die assembly with each of the first connecting members of the top die assembly aligning with a corresponding second connecting member of the bottom die assembly.

In the fifth step 704, each of the first connection members of the top die assembly is connected with the corresponding second connecting member of the bottom die assembly through a solder joint there-between such that the top die being in communication connection with the bottom die. The connecting process can be achieved through reflow process or thermal compression bonding process.

In another embodiment, the method for making a die-die stacking structure differs from the above described method in that in the first step, the top die assembly comprises a top die, a first insulation layer covering the bottom surface of the top die, a plurality of first bumps connecting with the bottom surface of the first insulation layer and a plurality of first connecting members passing through the first insulation layer to connect with the top die; the bottom die assembly comprises a bottom die, a second insulation layer covering the upper surface of the bottom die, a plurality of second bumps connecting with the top surface of the second insulation layer and a plurality of second connecting members passing through the second insulation layer to connect with the bottom die. In the second step of this embodiment, a protection material is applied onto the upper surface of the bottom die assembly to make the protection material bridge the plurality of second connecting members and second bumps to form a mesh layout. In the third step of this embodiment, the bottom surface of the top die assembly is made to dip into the protecting material to make the protection material bridge the plurality of first connecting members and first bumps to form a mesh layout.

Figure 1:
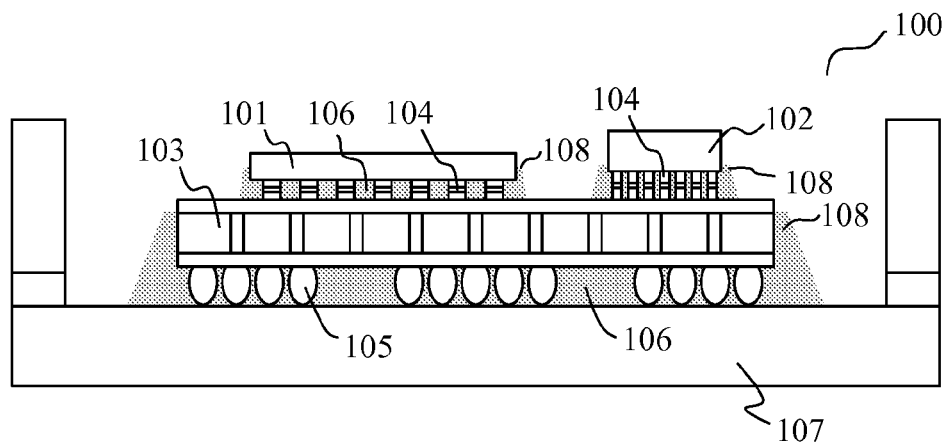
FIG. 1 depicts a structure schematic view of existing die-die stacking structure 100.
Figure 2:
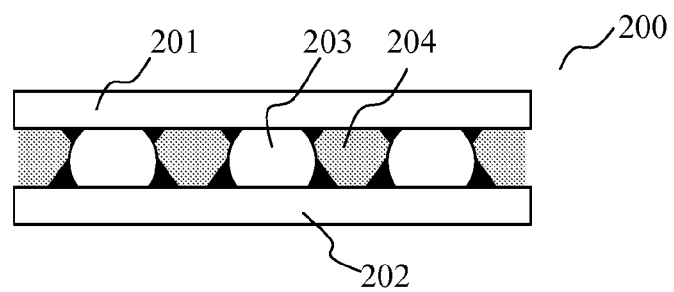
FIG. 2 depicts a structure schematic view of existing die-die stacking structure 200.
Figure 3:
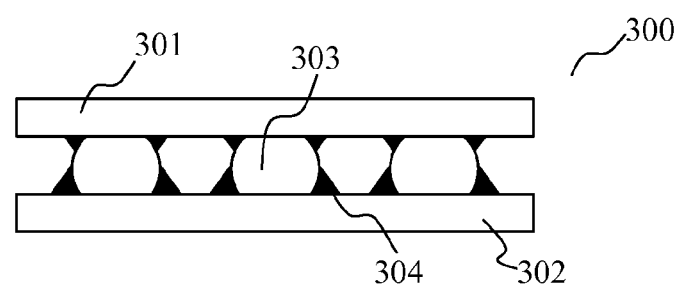
FIG. 3 depicts a structure schematic view of existing die-die stacking structure 300.

In the die-die stacking structure and the method of making the same in the present invention, the mesh layout and hollow space establish an open space between two stacking dies. So there is no void issue or delamination risk inside a fully filled room assembled by dispensing underfill or non-flow underfill or non-conductive paste (NCP). In addition, there is no underfill fillet or dispensing pattern in the die-die stacking structure. So there is no die edge crack or underfill bleeding risk. And there is no need to reserve die-die space or die-component space to accommodate underfill fillet. Further, compared with the process of FIGS. 2-3 assembled by protection-type flux, the present invention creates a mesh pattern across bumps and optimizes the protection material volume covering the bumps through optimized aspect ratio of bump space. The mesh pattern/structure provides more strength and stress buffer to resist die warpage and absorb thermal cycling stress, and then prevents the bump dielectric materials in the die-die stacking structure from cracking caused by thermal stress or external mechanical stress.

It will be apparent to those skilled in the art that various modifications and variations can be made to the embodiments described herein without departing from the spirit and scope of the claimed subject matter. Thus, it is intended that the specification covers modifications and variations of the various embodiments described herein, provided such modification and variations come within the scope of the appended claims and their equivalents.

What is claimed is:

1. A die assembly, comprising:
   a die having an upper surface and a bottom surface;
   an insulation layer covering at least one of the upper surface and the bottom surface of the die;
   a plurality of connection members which pass through the insulation layer to connect with the die;
   a protection material on the surface of the insulation layer;
   wherein the protection material bridges the plurality of connection members to form a mesh layout on the insulation layer.

2. The die assembly of claim 1, wherein each of the plurality of connection members comprises a first connecting element, wherein an end of the first connecting element passes through the insulation layer to connect with the die.

3. The die assembly of claim 1, wherein each of the plurality of connection members comprises a first connecting element and a second connecting element, wherein an end of the first connecting element passes through the insulation layer to connect with the die and the other end of the first connecting element connects with the second connecting element.

4. The die assembly of claim 2, wherein the material of the first connection member is conductive metal or alloy.

5. The die assembly of claim 3, wherein the material of the first connection member is conductive metal or alloy, and the second connecting element is Cu pillar.

6. The die assembly of any one of claims 1-5, wherein the material of the insulation layer is polyimide and the protection material is joint protection type flux, non-conductive paste or non-flow underfill.

7. A die assembly, comprising:
   a die having an upper surface and a bottom surface;
   an insulation layer covering at least one of the upper surface and the bottom surface of the die;
   a plurality of connection members which pass through the insulation layer to connect with the die;
   a plurality of dummy bump units on the surface of the insulation layer, the dummy bump units not connecting with the die;
   a protection material on the surface of the insulation layer;
   wherein the protection material bridges the plurality of connection members and the plurality of dummy bump units to form a mesh layout on the insulation layer.

8. The die assembly of claim 7, wherein each of the plurality of connection members comprises a first connecting element, wherein an end of the first connecting element passes through the insulation layer to connect with the die.

9. The die assembly of claim 7, wherein each of the plurality of connection members comprises a first connecting element and a second connecting element, wherein an end of the first connecting element passes through the insulation layer to connect with the die and the other end of the first connecting element connects with the second connecting element.

10. The die assembly of claim 8, wherein the material of the first connection member is conductive metal or alloy.

11. The die assembly of claim 9, wherein the material of the first connection member is conductive metal or alloy, and the second connecting element is Cu pillar.

12. The die assembly of any one of claims 7-11, wherein the material of the insulation layer is polyimide and the protection material is joint protection type flux, non-conductive paste or non-flow underfill.

13. The die assembly of claim 12, wherein the protection material covers a part of each of the plurality of connection members.

* * * * *